United States Patent
Van Haren

(10) Patent No.: US 7,462,548 B2
(45) Date of Patent: Dec. 9, 2008

(54) SUBSTRATE PROVIDED WITH AN ALIGNMENT MARK IN A SUBSTANTIALLY TRANSMISSIVE PROCESS LAYER, MASK FOR EXPOSING SAID MARK, DEVICE MANUFACTURING METHOD, AND DEVICE MANUFACTURED THEREBY

(75) Inventor: Richard Johannes Franciscus Van Haren, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 213 days.

(21) Appl. No.: 11/357,093

(22) Filed: Feb. 21, 2006

(65) Prior Publication Data

US 2006/0138682 A1    Jun. 29, 2006

Related U.S. Application Data

(60) Continuation of application No. 10/960,695, filed on Oct. 8, 2004, now Pat. No. 7,056,805, which is a division of application No. 10/151,317, filed on May 21, 2002, now Pat. No. 6,858,948.

(30) Foreign Application Priority Data

May 23, 2001    (EP)    ................... 01201956

(51) Int. Cl.
    *H01L 21/76* (2006.01)
(52) U.S. Cl. ...................... 438/401; 257/797
(58) Field of Classification Search ............. 438/401, 438/462; 257/797; 430/5, 22
    See application file for complete search history.

(56) References Cited

U.S. PATENT DOCUMENTS

| | | | |
|---|---|---|---|
| 5,151,750 | A | 9/1992 | Magome et al. |
| 5,532,091 | A | 7/1996 | Mizutani |
| 5,917,205 | A | 6/1999 | Mitsui et al. |
| 6,093,640 | A | 7/2000 | Hsu et al. |
| 6,165,656 | A | 12/2000 | Tomimatu |
| 6,180,498 | B1 | 1/2001 | Geffken et al. |
| 6,301,001 | B1 | 10/2001 | Unno |
| 6,876,092 | B2 | 4/2005 | Ballarin |
| 7,068,833 | B1 * | 6/2006 | Ghinovker et al. .......... 382/144 |
| 2003/0026471 | A1 | 2/2003 | Adel et al. |

FOREIGN PATENT DOCUMENTS

EP    0 389 209 A2    9/1990

(Continued)

OTHER PUBLICATIONS

European Search Report for Application No. 01201956.8, dated Dec. 21, 2001.

Dr. Stephen Thoms' "Quantum Transport in Low Dimensional Structures (Fabrication)", The Nanoelectronics Research Centre, Department of Electronics and Electrical Engineering, The University of Glasgow, Final Report: Grant GR/K97196, Aug. 22, 2003, 7 pages.

(Continued)

*Primary Examiner*—Tuan H Nguyen
(74) *Attorney, Agent, or Firm*—Pillsbury Winthrop Shaw Pittman LLP

(57) ABSTRACT

A substrate provided with an alignment mark in a substantially transmissive process layer overlying the substrate, said mark comprising high reflectance areas for reflecting radiation of an alignment beam of radiation, and low reflectance areas for reflecting less radiation of the alignment beam, wherein the high reflectance areas comprise at least one substantially linear sub-grating. In one example, a substantially linear sub-grating comprises a plurality of spaced square regions.

18 Claims, 3 Drawing Sheets

FOREIGN PATENT DOCUMENTS

| | | |
|---|---|---|
| EP | 0 389 209 A3 | 9/1990 |
| EP | 0 997 782 A1 | 5/2000 |
| EP | 1 162 507 A2 | 12/2001 |
| JP | 3-3224 A | 1/1991 |
| JP | 4-303915 A | 10/1992 |
| JP | 4-3307010 | 11/1992 |
| JP | 6-120117 A | 4/1994 |
| JP | 7-221166 A | 8/1995 |
| JP | 9-162102 A | 6/1997 |
| JP | 2001-44105 A | 2/2001 |

OTHER PUBLICATIONS

Webster's II New Riverside University Dictionary & Title Page and Copyright page & p. 822.

European Search Report for EP 03077203.2, dated Jun. 24, 2004.

Translation of Japanese Office Action issued in Japanese Patent Application No. 2002-182181 mailed May 19, 2006.

Translation of Japanese Office Action issued in Japanese Appln. No. 2002-182180 mailed Aug. 1, 2006.

* cited by examiner

SUBSTRATE PROVIDED WITH AN ALIGNMENT MARK IN A SUBSTANTIALLY TRANSMISSIVE PROCESS LAYER, MASK FOR EXPOSING SAID MARK, DEVICE MANUFACTURING METHOD, AND DEVICE MANUFACTURED THEREBY

This application is a continuation application and claims priority to U.S. patent application Ser. No. 10/960,695 filed Oct. 8, 2004 now U.S. Pat. No. 7,056,805, which is a divisional application of U.S. patent application Ser. No. 10/151,317, filed May 21, 2002 and now patented as U.S. Pat. No. 6,858,948, which claims priority to EP 01201956.8, filed May 23, 2001, each of which are herein incorporated by reference.

FIELD

The present invention relates to alignment marks.

BACKGROUND

In general, a substrate may be processed in a lithographic projection apparatus comprising: a radiation system to supply a projection beam of radiation; a support structure to support patterning structure, the patterning structure serves to pattern the projection beam according to a desired pattern; a substrate table to hold a substrate; and a projection system to project the patterned beam onto a target portion of the substrate.

The term "patterning structure" as here employed should be broadly interpreted as referring to structure or means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC.

Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "*Microchip Fabrication: A Practical Guide to Semiconductor Processing*", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Patent Application WO 98/40791, incorporated herein by reference.

This invention relates to an alignment mark for use in an alignment system of a lithographic projection apparatus for aligning the pattern in the patterning structure to the substrate. This alignment system, for example, the indirect off-axis alignment system described in PCT Patent Application WO 98/39689 incorporated herein by reference, employs an alignment beam of radiation that is radiated by a separate alignment unit and that is incident on a mark, in the form of a grating on the substrate. The grating diffracts the alignment beam into a number of sub-beams extending at different angles to the normal of the grating. Said distinct sub-beams will be directed with a lens of the alignment unit to different positions in a plane. In this plane means may be provided for further separating the different sub-beams. The lens system will also be used to finally image the different sub-beams on a reference plate to create an image of the mark. In this reference plate a reference mark can be provided and a radiation sensitive detector can be arranged behind the reference mark. The output signal of the detector will be dependent on the extent to which the image of the substrate mark and the reference mark coincide. In this way the extent of alignment of the mark on the substrate with the reference mark in the alignment unit can be measured and optimized. The detector may comprise separate individual detectors for measuring the intensity and the aligned position at different orders. To finish the alignment, the reference in the alignment unit has to be aligned to a second reference mark, for example, one provided to the substrate table with the alignment unit. This second reference mark may then be aligned to a mark in the mask using exposure light. An apparatus and method as described in U.S. Pat. No. 5,144,363, incorporated herein by reference can be used for that purpose.

Alternatively, a direct on-axis alignment system can be used that directs an alignment beam directly upon a mark provided on the substrate via the projection system. This beam will be diffracted by the mark on the substrate into different sub-beams and will be reflected into the projection system. After traversing the projection system the different sub-beams will be focussed on a reference alignment mark provided to the mask. The image of the substrate mark formed by the sub-beams can be imaged upon the reference mark in the mask. In this way the extent of alignment of the mark on the substrate and the reference mark in the mask can be measured and optimized. This can be done by using a radiation sensitive detector constructed and arranged to detect the alignment beam traversing the mark in the mask. For more information with respect to the on-axis alignment system here described see, for example, U.S. Pat. No. 4,778,275 incorporated herein by reference.

To improve the speed of integrated circuits produced with the lithographic projection apparatus, it is proposed to use low resistance materials, such as copper, as a conductor to decrease time delays in the circuits. To fabricate integrated circuits with copper, a new substrate processing technique known as copper dual damascene is introduced in the manufacturing of integrated circuits. One of the problems that occurs with this new processing technique is that during alignment to marks embedded in a copper dual damascene layer a weak or even no signal is measured by the alignment system. It is discovered that the radiation of the alignment beam traversing through the mark and the copper dual damascene layer to the substrate surface may reflect thereupon and may traverse back to the alignment mark where it may interfere with radiation of the alignment beam directly reflected upon the mark. The problem is caused by the layer of copper dual damascene being substantially transmissive for the alignment beam of the alignment system. The interference is largely dependent on the thickness of the copper dual damascene layer on which the mark is laying. It is however very difficult to control the thickness of the layer to such an extent that the interference can be avoided.

SUMMARY

In an aspect of at least one embodiment of the present invention, there is provided a mark that can be used in a transmissive process layer and which doesn't suffer from a decrease in signal strength caused by interference of light traversing through the mark and reflecting upon the substrate surface.

According to at least one embodiment of the invention, a substrate is provided with an alignment mark in a substantially transmissive process layer overlying the substrate, said mark comprising:

relatively high reflectance areas for reflecting radiation of an alignment beam of radiation; and relatively low reflectance areas for reflecting less radiation of the alignment beam, wherein the relatively low reflectance areas comprise scattering structures for scattering and absorbing radiation of the alignment beam.

According to at least one embodiment of the invention, there is provided a device manufacturing method comprising:

providing a substrate comprising alignment marks in a transmissive layer that is at least partially covered by a layer of radiation sensitive material to a substrate table;

aligning the alignment marks comprising relatively high and relatively low reflectance areas to a reference with an alignment beam of radiation;

providing a projection beam of radiation using a radiation system;

using patterning structure to endow the projection beam with a pattern in its cross-section; and projecting the patterned beam of radiation onto a target portion of the layer of radiation sensitive material, wherein the relatively low reflectance areas comprise scattering structures for scattering and absorbing the alignment beam.

Although specific reference may be made in this text to the use of the apparatus according to at least one embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts and in which.

DETAILED DESCRIPTION

Figure 1:
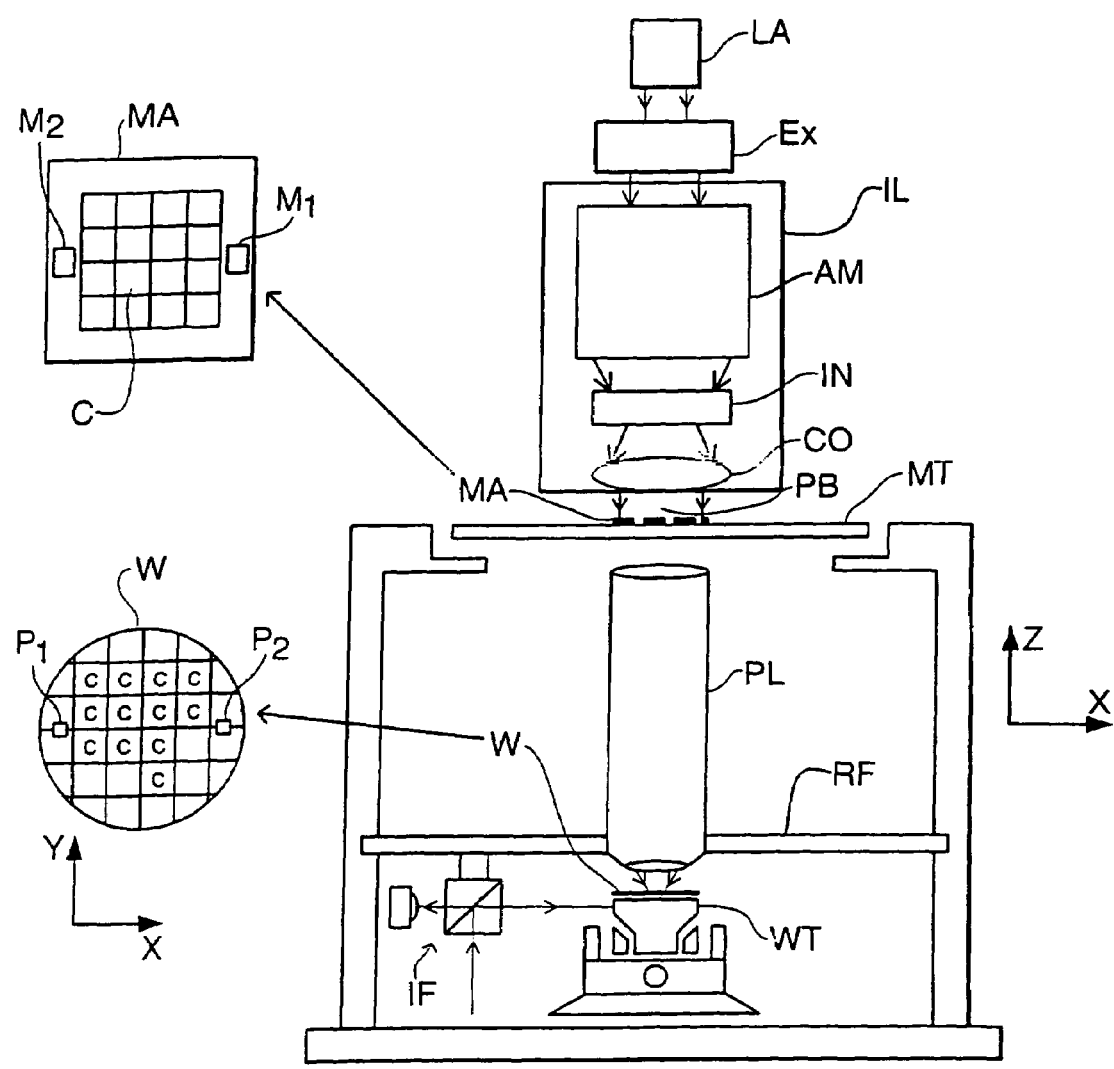
FIG. 1 depicts a lithographic projection apparatus in which at least one embodiment of the invention can be used.

FIG. 1 schematically depicts a lithographic projection apparatus in which the substrate provided with the mark according to at least one embodiment of the invention can be used. The apparatus comprises:

a radiation system Ex, IL, for supplying a projection beam PB of radiation (e.g. UV or EUV radiation). In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL; and a projection system ("lens") PL (e.g. a refractive or catadioptric system, a mirror group or an array of field deflectors) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a HG lamp, an excimer laser, an undulator provided around a path of an electron beam in a storage ring or synchrotron) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M =¼ or ⅕). In this manner, a relatively large target portion C can be exposed, without having to compromise on resolution.

For alignment purposes, the mask is provided with marks ($M_1$ and $M_2$) in the mask MA. These marks ($M_1$ and $M_2$) may be aligned directly or indirectly through the projection system PL to marks ($P_1$ and $P_2$) in the substrate W. During this alignment, information will be obtained about the position of the image C projected through the projection system PL upon the substrate W. This is necessary to assure that different layers exposed with different masks are correctly positioned with respect to each other. It is therefore necessary that before exposure of each layer the image in the mask MA is aligned to the same substrate marks ($P_1$ and $P_2$).

Figure 2:
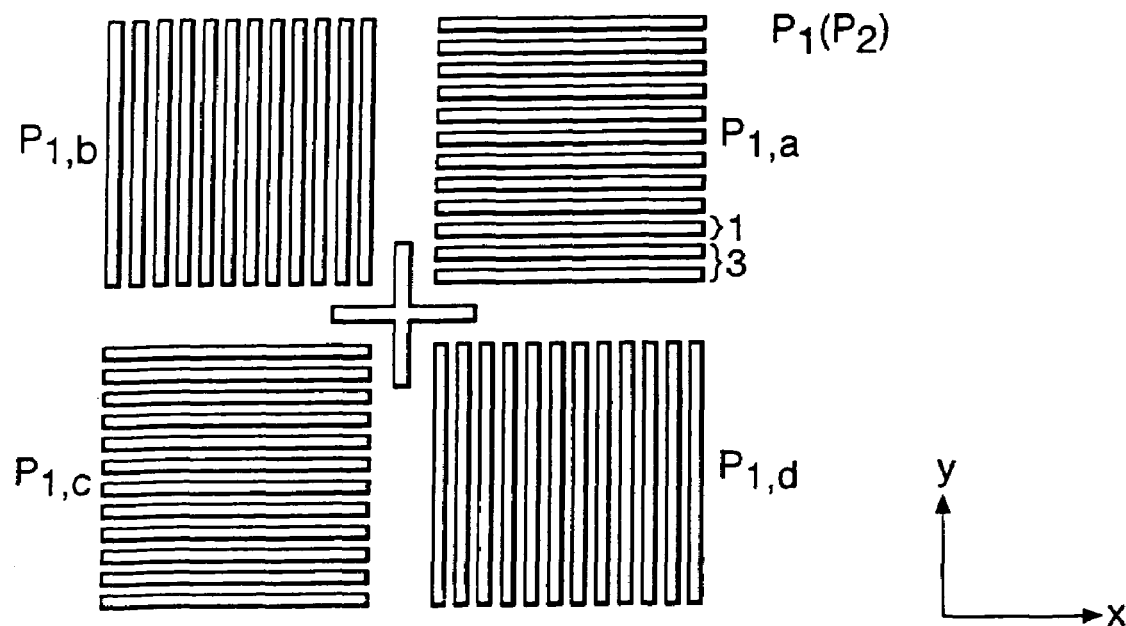
FIG. 2 depicts an alignment mark in which at least one embodiment of the invention can be used.

FIG. 2 depicts a substrate alignment mark wherein at least one embodiment of the invention can be used. Such an alignment mark may comprise four sub-gratings $P_{1,a}$, $P_{1,b}$, $P_{1,c}$ and $P_{1,d}$, of which the sub-gratings $P_{1,b}$ and $P_{1,d}$ serve for alignment in the X direction and the sub-gratings $P_{1,a}$ and $P_{1,c}$ serve for alignment in the Y direction. The sub-gratings may have a grating period of, for example, 16 μm. The grating period may be different for each sub-grating and the dimensions of the sub-grating may be 200*200 μm. Each sub-grating comprises relatively high reflectance areas 3 and relatively low reflectance areas 1.

It is discovered that by the use of scattering elements in the low reflectance areas the alignment beam is scattered away so that less radiation will traverse the transmissive layer to reflect at the surface of the substrate and traverse back to the mark to cause interference with the alignment beam reflected at the high reflectance areas. The scattering structures may be provided in the same exposure step in which the high reflectance areas are exposed. If the scattering structures of the alignment mark are formed as a grating with lines in a first direction, the relatively high reflectance areas may be provided as a grating with lines perpendicular to said first direction. The alignment system used for detecting the position of the mark will be sensitive for the directions of the lines in the grating formed by the relatively high reflectance areas because the light will be mainly diffracted in a direction perpendicular to said lines. The alignment system will not be sensitive to radiation diffracted by the scattering structures because the direction in which that light is diffracted will be perpendicular to the direction of the radiation diffracted by the relatively high reflectance areas. The grating period of the grating used as the scattering structure may be smaller than the grating period of the grating for the relatively high reflectance areas such that the radiation diffracted by the relatively high reflectance areas is diffracted with a smaller angle to the normal of the mark. The alignment system may be sensitive for radiation diffracted at a certain angle to the normal of the mark and therefore only be sensitive for radiation diffracted by the relatively high reflectance areas.

Figure 3:
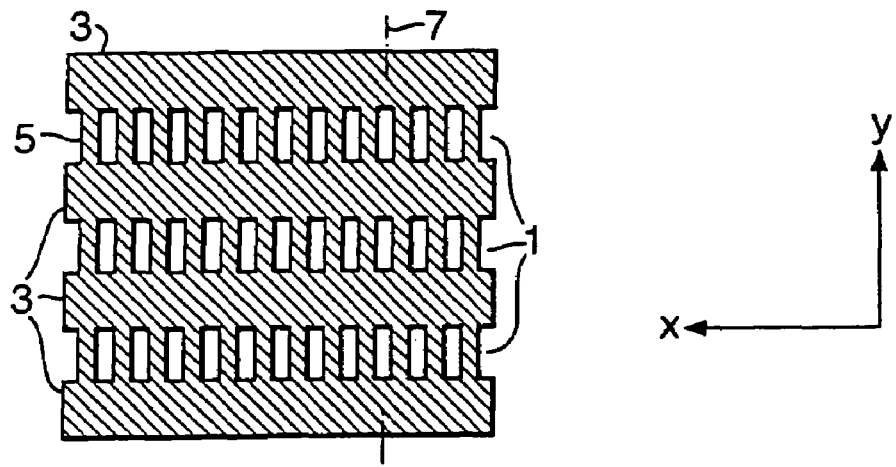
FIG. 3 depicts a top view of a part of a sub-grating of the alignment mark of FIG. 2 according to at least one embodiment of the invention.

FIG. 3 depicts a top-view on a part of a sub-grating, for example $P_{1,a}$, of the alignment mark of FIG. 2. What is shown is four high reflectance areas 3 forming a grating with a grating period in the Y direction and three low reflectance areas 1. The low reflectance areas 1 are provided with a scattering structure having the form of a grating with a grating period in the X direction with a small size, for example a period smaller than 2 μm, for example, 1.14 μm. The function of the scattering structure in the low reflectance areas is to scatter and absorb the radiation of the alignment beam that is incident upon the low reflectance areas, so as to prevent radiation traversing through the low reflectance areas reflecting from the substrate surface and traversing back to the mark to interfere with that part of the alignment beam that is reflected by the high reflectance areas, causing a disturbance of the alignment signal. The direction of the grating in the low reflectance area is chosen to be substantially perpendicular to the direction of the grating of the high reflectance areas so that a part of the alignment beam diffracted from the low reflectance areas will be diffracted in a different direction than the part of the beam diffracted from the high reflectance area. The part of the alignment beam diffracted from the low reflectance area will not reach the alignment system, because the alignment system is only sensitive to diffraction in a particular direction. The diffraction from the low-reflectance areas will therefore not disturb the alignment system. The period of the grating in the low-reflectance area is also smaller than the period of the grating provided to the high reflectance area. The angle of diffraction with the normal of the mark will therefore be greater and the chance that the radiation diffracted from the low reflectance area will disturb the alignment system will be further minimized. The high reflectance areas may have a reflectivity of 50-100% and the low reflectance areas may have a reflectivity of 0-10%. A layer of copper dual damascene, for example, may have a reflectivity of 4%.

Figure 4:
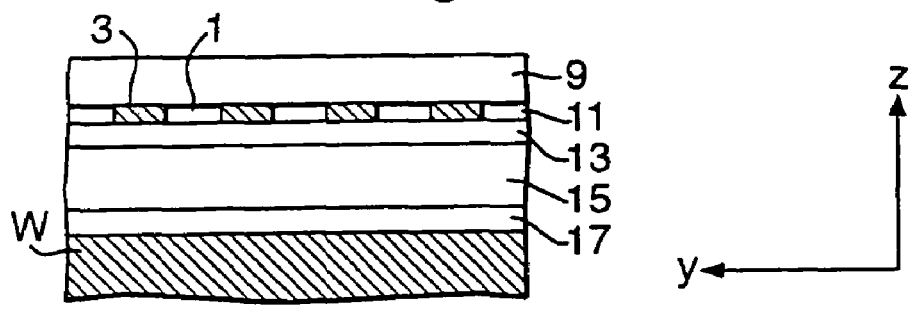
FIG. 4 depicts a cross-sectional view of an alignment mark embedded in a transmissive layer on a substrate.

FIG. 4 depicts a cross-sectional view along the line 7 in FIG. 3 on an alignment mark embedded in a transmissive layer 11 on a substrate W. The substrate W is covered with five process layers (9, 11, 13 15 and 17) that have been exposed with a patterned beam in subsequent exposures on the substrate W. One of the layers (11) is provided with an alignment mark having high reflectance 3 and low reflectance areas 1. In case the layers (9, 11, 13, 15 and 17) are transmissive and no scattering structures are provided in the low reflectance areas 1 the radiation of the alignment beam from the alignment system may traverse through the low reflectance areas 1 and may reflect upon the surface of the substrate W. Subsequently, the radiation reflected upon the surface may reach the alignment mark again and interference may occur with that part of the alignment beam that is directly reflected at the mark surface. The scattering features provided in the low reflectance areas according to at least one embodiment of the invention will minimize the effects of reflection at the surface of the substrate.

Figure 5:
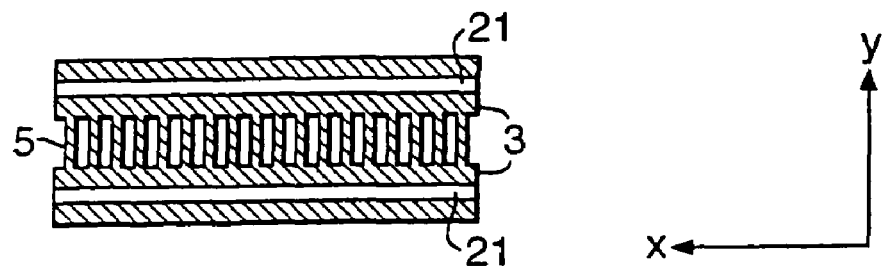
FIG. 5 depicts a top view of a part of a sub-grating of the alignment mark of FIG. 2 according to at least one embodiment of the invention.

FIG. 5 depicts a top view on a part of a sub-grating of the alignment mark of FIG. 2 according to at least one embodiment of the invention. Two high reflectance areas 3 and one low reflectance area 5 are shown. This embodiment(s) shares most items with the embodiment(s) described earlier, a difference being that the lines of the grating forming the high reflectance areas 3 are segmented in two by having a low reflectance area 21 in the middle of the high reflectance areas 3. The low reflectance area 21 is parallel to the lines forming the grating of the high reflectance areas 3. The additional low reflectance area increases the diffraction in higher orders of the alignment beam by the grating formed by the high reflectance areas, which is advantageous because higher orders give better information of the position of the mark. As shown, the high reflectance areas 3 are segmented in two by having one low reflectance area 21 in the middle. It is possible that the high reflectance areas are segmented in three, four or five parts to improve the diffraction in higher orders and hence improve the accuracy of alignment.

Figure 6:
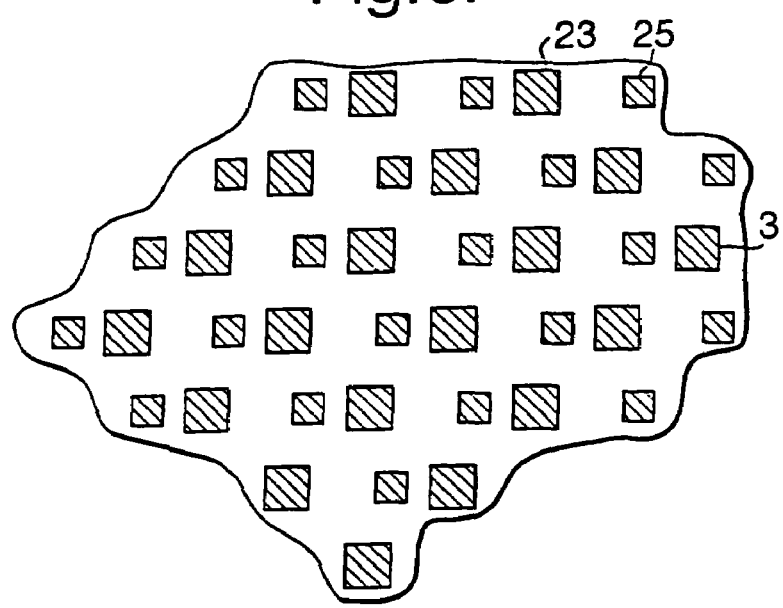
FIG. 6 shows a detailed top view of a reflective area of a mark according to at least one embodiment of the invention.

FIG. 6 shows a detailed top view on a part of a high reflectance area of a mark according to at least one embodiment of the invention. The high reflectance area is built up out of square surfaces, each square being repeated in first and second directions and having sides parallel to said first and second directions. As shown here there are two types of square surfaces—large ones 23 and small ones 25—which are repeated to form the high reflectance area 3. The size of the squares is comparable with the size of the structures that are exposed from the mask onto the substrate and there may also be more than two sizes of squares. A comparable size of the squares in the high reflectance area of the mark and the structure to be exposed is advantageous because the diffraction by structures to be exposed is in that case similar to the diffraction by high reflectance areas of the mark. An advantage of this similar diffraction is that beams with a similar diffraction will traverse a similar optical path through the projection system and therefore will suffer from the same aberrations in the projection system. The positional deviation caused by those aberrations will be similar for the alignment mark and the structures to be exposed leading to a better-aligned position. The size of the squares may be in the range from 0.05 to 0.5 μm. It must be understood that this at least one embodiment of the invention also may be used without the use of any scattering structures in the low-reflectance areas of the alignment mark, for example directly in the high reflectance areas 3 of the alignment mark of FIG. 2. The at least one embodiment of the invention can also be used in a mark suitable for measuring overlay; in that case the mark may have the form of a large square. The square will in that case comprise a large number of smaller squares having a size comparable with the size of the structures to be exposed.

As an alternative one could measure the position of the different diffraction orders in the pupil plane of the projection system PL of a particular structure to be exposed in the lithographic apparatus. The positions in the pupil plane give information of the amount of diffraction that occurred with said particular structure. Subsequently, one could measure the position of the different diffraction orders in the pupil plane of an alignment mark and alter that alignment mark such that the position of the different diffraction orders in the pupil plane of the alignment mark and the structure to be exposed become similar. One could also use simulation software for obtaining a mark that diffracts to similar position in the pupil plane as a structure to be exposed in the lithographic projection apparatus. Again the high reflectance areas of the mark will be diffracted similar as the structures to be exposed in the lithographic projection apparatus and will suffer from the same aberrations in the projection system giving the same positional deviations and a better aligned position.

While specific embodiments of the invention have been described above, it will be appreciated that the invention may be practiced otherwise than as described. The description is not intended to limit the invention.

What is claimed is:

1. A mark for use in lithographic overlay measurements, comprising:
    at least one relatively high reflectance area to reflect radiation of an alignment beam of radiation; and
    at least one relatively low reflectance area to reflect less radiation of the alignment beam,
    wherein the at least one relatively high reflectance area comprises a plurality of substantially linear sub-gratings, at least one of the substantially linear sub-gratings comprising a plurality of spaced square regions.

2. The mark of claim 1, wherein the plurality of substantially linear sub-gratings comprise a plurality of parallel lines.

3. The mark of claim 2, wherein the plurality of substantially linear sub-gratings comprise four sub-gratings mutually arranged such that lines contained within a first sub-grating run substantially perpendicular to lines contained in each sub-grating that is opposed along a common edge to the first sub-grating, and wherein the lines within the first sub-grating run substantially parallel to lines contained in a sub-grating diagonally opposed to the first sub-grating.

4. The mark of claim 3, wherein the plurality of substantially linear sub-gratings are mutually arranged to define a substantially square shape.

5. The mark of claim 2, wherein each square region has a size in the range of about 0.05 to 0.5 micrometers.

6. The mark of claim 2, wherein the mark is disposed within a layer that is substantially transmissive to an alignment beam used for the lithographic overlay measurements.

7. The mark of claim 6, wherein the layer is a copper dual damascene layer.

8. The mark of claim 1, wherein the square regions are high reflectance areas.

9. The mark of claim 1, wherein a first substantially linear sub-grating of the plurality of substantially linear sub-gratings is defined by a first grating pitch, and a second substantially linear sub-grating of the plurality of substantially linear sub-gratings is defined by a second grating pitch different from the first grating pitch.

10. The mark of claim 1, wherein the relatively high reflectance area has a reflectance of about fifty to one hundred percent, and wherein the relatively low reflectance area has a reflectance of about zero to ten percent.

11. A mask comprising a pattern for exposing an alignment mark, the alignment mark comprising:
    at least one relatively high reflectance area to reflect radiation of an alignment beam of radiation; and
    at least one relatively low reflectance area to reflect less radiation of the alignment beam,
    wherein the at least one relatively high reflectance area comprises a plurality of substantially linear sub-gratings, at least one of the substantially linear sub-gratings comprising a plurality of spaced square regions.

12. The mask of claim 11, wherein the square regions are high reflectance areas.

13. The mask of claim 11, wherein the plurality of substantially linear sub-gratings comprise four sub-gratings mutually arranged such that lines contained within a first sub-grating run substantially perpendicular to lines contained in each sub-grating that is opposed along a common edge to the first sub-grating, and wherein the lines within the first sub-grating run substantially parallel to lines contained in a sub-grating diagonally opposed to the first sub-grating.

14. The mask of claim 13, wherein the plurality of substantially linear sub-gratings are mutually arranged to define a substantially square shape.

15. Simulation software for obtaining an alignment mark, wherein the alignment mark comprises:
    at least one relatively high reflectance area to reflect radiation of an alignment beam of radiation; and
    at least one relatively low reflectance area to reflect less radiation of the alignment beam, wherein the at least one relatively high reflectance area comprises a plurality of substantially linear sub-gratings, at least one of the substantially linear sub-gratings comprising a plurality of spaced square regions.

16. The simulation software of claim 15, wherein the square regions are high reflectance areas.

17. The simulation software of claim 15, wherein the plurality of substantially linear sub-gratings comprise four sub-gratings mutually arranged such that lines contained within a first sub-grating run substantially perpendicular to lines contained in each sub-grating that is opposed along a common edge to the first sub-grating, and wherein the lines within the first sub-grating run substantially parallel to lines contained in a sub-grating diagonally opposed to the first sub-grating.

18. The simulation software of claim 17, wherein the plurality of substantially linear sub-gratings are mutually arranged to define a substantially square shape.

* * * * *